(12) United States Patent
Tokunaga

(10) Patent No.: US 11,647,306 B2
(45) Date of Patent: May 9, 2023

(54) SOLID-STATE IMAGING DEVICE AND CAMERA

(71) Applicant: Panasonic Intellectual Property Management Co., Ltd., Osaka (JP)

(72) Inventor: Yusuke Tokunaga, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 10 days.

(21) Appl. No.: 17/521,911

(22) Filed: Nov. 9, 2021

(65) Prior Publication Data

US 2022/0070397 A1    Mar. 3, 2022

Related U.S. Application Data

(63) Continuation of application No. PCT/JP2020/017887, filed on Apr. 27, 2020.

(30) Foreign Application Priority Data

Jun. 25, 2019  (JP) .............................. JP2019-117538

(51) Int. Cl.
*H04N 5/365*  (2011.01)
*H03M 1/46*  (2006.01)
(Continued)

(52) U.S. Cl.
CPC ............ *H04N 5/3655* (2013.01); *H03M 1/46* (2013.01); *H04N 5/378* (2013.01); *H04N 5/3765* (2013.01);
(Continued)

(58) Field of Classification Search
CPC ............. H04N 5/3655; H04N 5/37452; H04N 5/37455; H04N 5/3765; H04N 5/378;
(Continued)

(56) References Cited

U.S. PATENT DOCUMENTS 8,350,736 B2\*  1/2013  Chern ................. H03M 1/1019
                                              360/75
2014/0034812 A1\*  2/2014  Ikuma .................. H04N 5/3577
                                              250/208.1
(Continued)

FOREIGN PATENT DOCUMENTS

JP   2002-530916    9/2002
WO   2000/030249    5/2000
(Continued)

OTHER PUBLICATIONS

International Search Report of PCT application No. PCT/JP2020/017887 dated Jul. 21, 2020.

*Primary Examiner* — Nhan T Tran
(74) *Attorney, Agent, or Firm* — McDermott Will & Emery LLP

(57) ABSTRACT

A solid-state imaging device includes: a pixel unit that outputs a pixel signal corresponding to an amount of incident light; an A/D converter that performs A/D conversion on the pixel signal; and a D/A conversion circuit that generates a reference signal to be used by the A/D converter. The D/A conversion circuit includes a first buffer circuit that outputs a base voltage VTOP for generating the reference signal, and the first buffer circuit includes a differential pair circuit including a first transistor and a second transistor, and a suppression circuit that suppresses a variation in the base voltage by canceling out a characteristic difference between the first transistor and the second transistor.

14 Claims, 17 Drawing Sheets

(51) Int. Cl.
*H04N 5/3745* (2011.01)
*H04N 5/376* (2011.01)
*H04N 5/378* (2011.01)

(52) U.S. Cl.
CPC ..... *H04N 5/37452* (2013.01); *H04N 5/37455* (2013.01)

(58) Field of Classification Search
CPC .......... H03M 1/46; H03M 1/08; H03M 1/123; H03M 1/1295; H03M 1/56; H03K 3/011
See application file for complete search history.

(56) References Cited

U.S. PATENT DOCUMENTS

| | | | | |
|---|---|---|---|---|
| 2014/0252208 | A1* | 9/2014 | Fujinaka | ................ H04N 5/378 250/208.1 |
| 2015/0077610 | A1* | 3/2015 | Shishido | .............. H04N 5/3742 348/303 |
| 2016/0316168 | A1 | 10/2016 | Nishimura et al. | |

FOREIGN PATENT DOCUMENTS

| | | |
|---|---|---|
| WO | 2012/144234 | 10/2012 |
| WO | 2013/076919 | 5/2013 |
| WO | 2013/179573 | 12/2013 |
| WO | 2015/111371 | 7/2015 |

\* cited by examiner

SOLID-STATE IMAGING DEVICE AND CAMERA

BACKGROUND

1. Technical Field

The present disclosure relates to a solid-state imaging device and a camera.

2. Description of the Related Art

Japanese Patent No. 6152992 proposes a technique that adds an external capacitive element to a digital-to-analog conversion circuit (DAC) which generates a reference voltage for analog-to-digital (ND) conversion of pixel signals, and pre-charges this external capacitive element with a pre-charge amplifier.

SUMMARY

One non-limiting and exemplary embodiment provides a solid-state imaging device and a camera that reduce noise originating from a manufacturing variation of a buffer circuit.

In one general aspect, the techniques disclosed here feature a solid-state imaging device including: a pixel unit that outputs a pixel signal corresponding to an amount of incident light; an analog-to-digital (A/D) converter that performs A/D conversion on the pixel signal; and a digital-to-analog (D/A) conversion circuit that generates a reference signal to be used by the A/D converter. The D/A conversion circuit includes a first buffer circuit that outputs a base voltage for generating the reference signal, and the first buffer circuit includes a differential pair circuit including a first transistor and a second transistor and a suppression circuit that suppresses a variation in the base voltage by canceling out a characteristic difference between the first transistor and the second transistor.

According to the solid-state imaging device of the present disclosure, it is possible to reduce noise originating from a manufacturing variation of a buffer circuit.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Underlying Knowledge Forming Basis of the Present Disclosure)

For the digital-to-analog conversion circuit of Japanese Patent No. 6152992 described in the section of "BACKGROUND", the present inventor has found a problem that noise may be generated in an image due to the manufacturing variation of a buffer circuit included in the digital-to-analog conversion circuit and that noise originating from the manufacturing variation is easily generated particularly in an image captured in a dark environment.

This problem will be described below using FIGS. 15 to 17.

Figure 4:
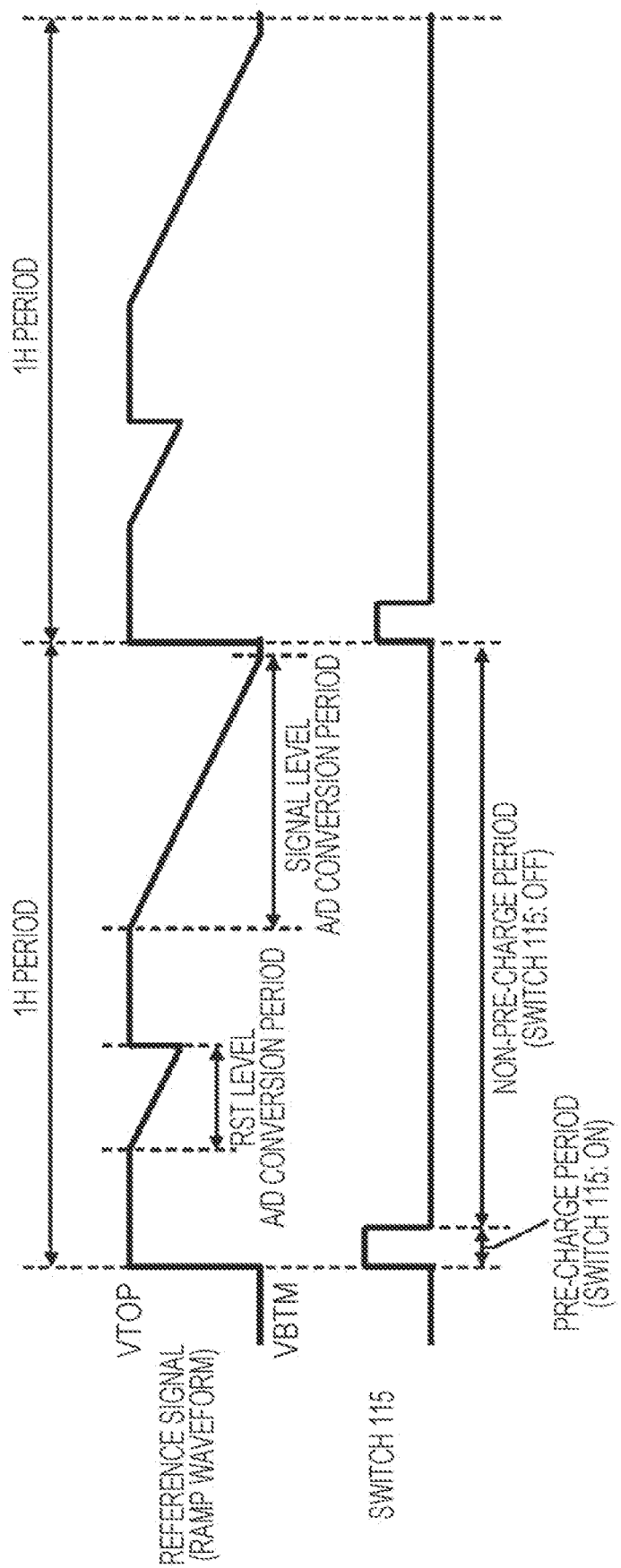
FIG. 4 is a time chart illustrating a reference signal (ramp waveform) and a pre-charge period in Embodiment 1.
Figure 15:
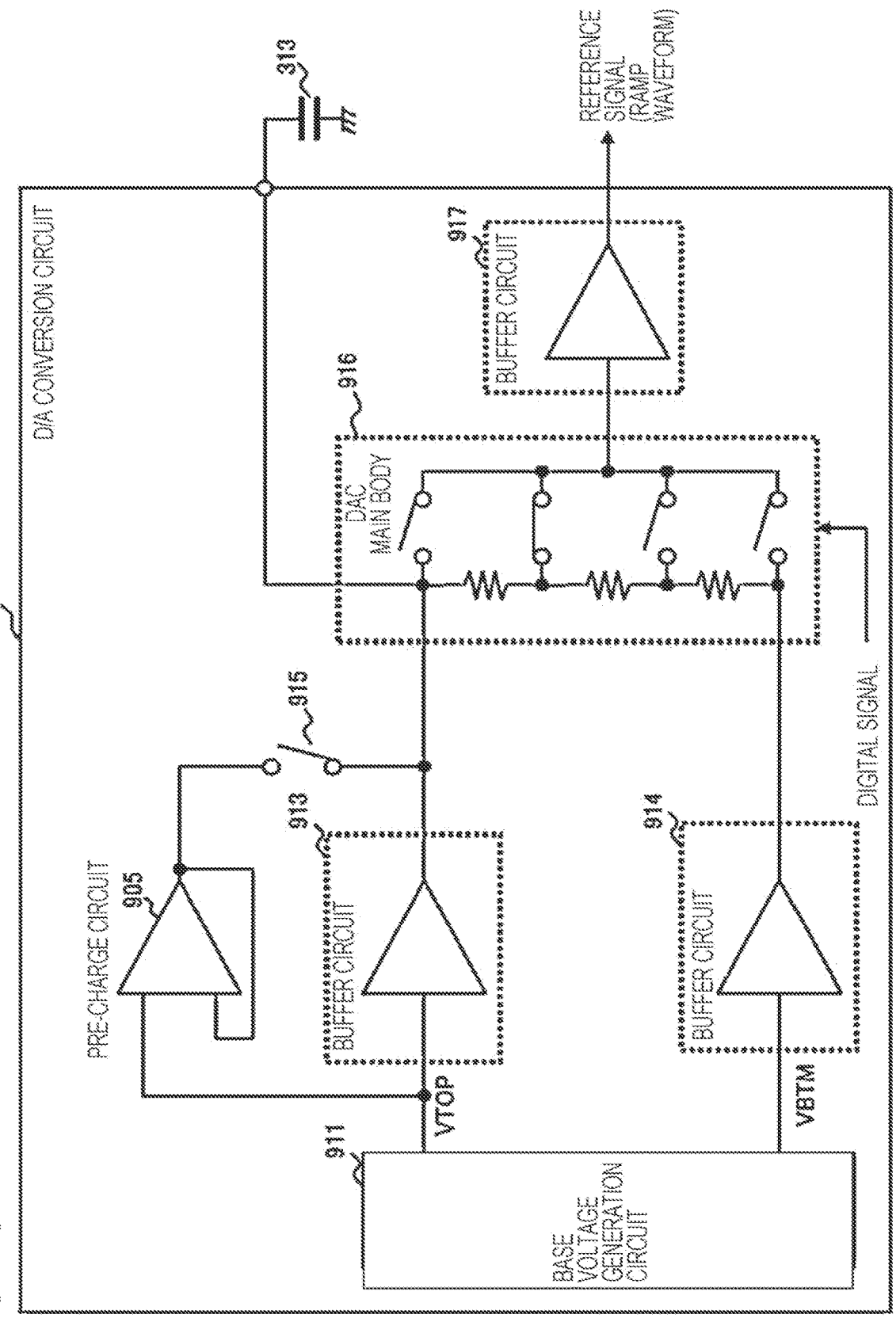
FIG. 15 is a circuit diagram illustrating a D/A conversion circuit substantially corresponding to FIG. 4 of Japanese Patent No. 6152992.

FIG. 15 is a circuit diagram illustrating a D/A conversion circuit 901 substantially corresponding to FIG. 4 of Japanese Patent No. 6152992.

This D/A conversion circuit 901 is included in a solid-state imaging device (i.e., image sensor) and generates a reference voltage to be used in A/D conversion of pixel signals. For this purpose, the D/A conversion circuit 901 includes a pre-charge circuit 905, a base voltage generation circuit 911, a buffer circuit 913, a buffer circuit 914, a DAC main body 916, and a buffer circuit 917. Here, the reference voltage is, for example, a triangular wave signal having a ramp waveform.

The pre-charge circuit 905 is a circuit that pre-charges a capacitive element 313 externally connected to the D/A conversion circuit 901.

According to the description of Japanese Patent No. 6152992 on and after paragraph 0050, low noise is achieved by equipping the buffer circuit 913, which transmits a base voltage VTOP in the D/A conversion circuit 901, with the external capacitive element 313 at its output end. However, since the capacitance of the external capacitive element 313 is large (e.g., several μF), it cannot be charged at a sufficient speed with the buffer circuit 913. For this reason, the pre-charge circuit 905, which is dedicated to high-speed driving, is driven with necessary timing to achieve high-speed charge of the external capacitive element 313.

Figure 16:
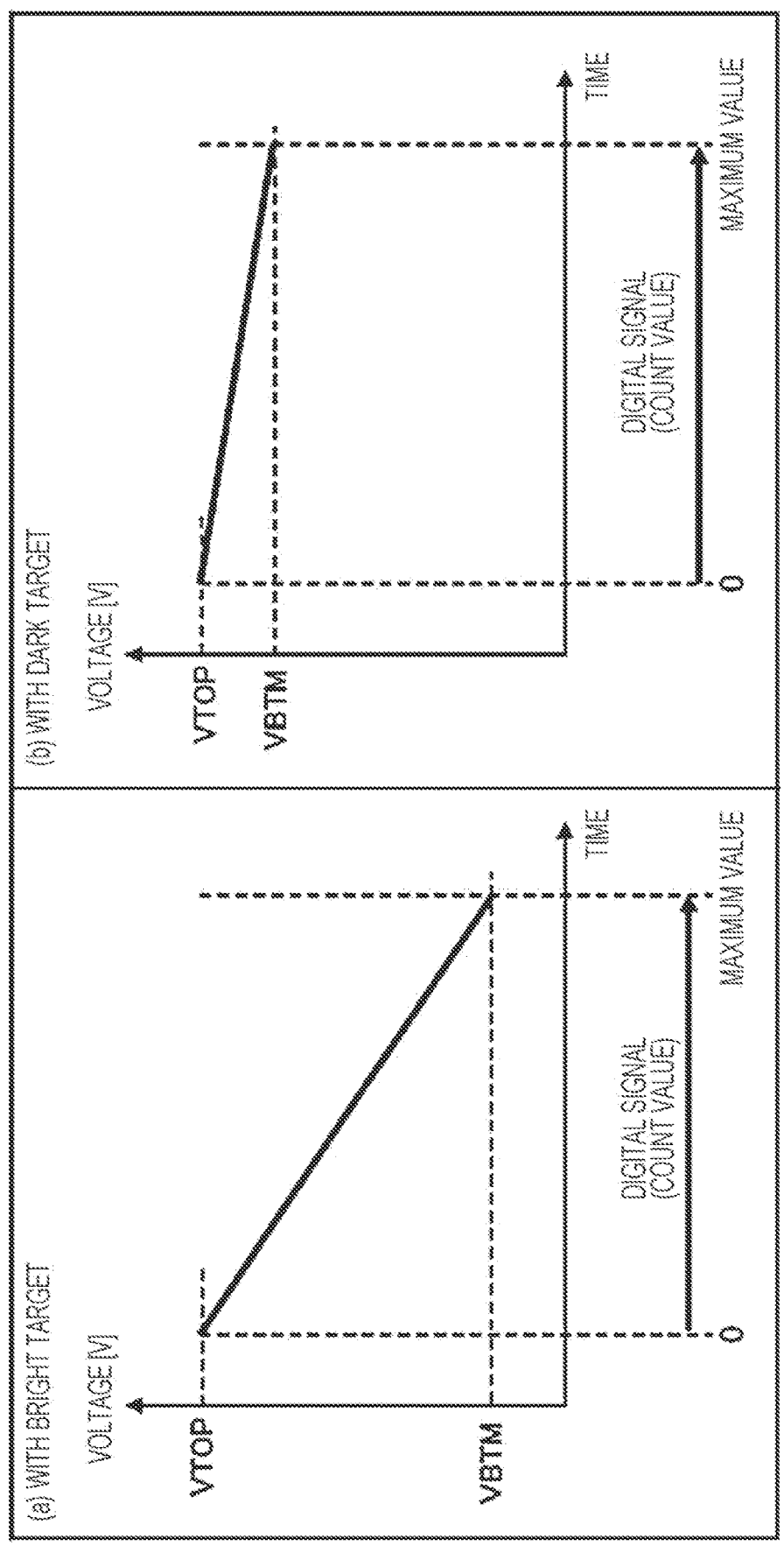
FIG. 16 is a diagram illustrating conversion characteristics of the D/A conversion circuit.

FIG. 16 is a diagram illustrating conversion characteristics of the D/A conversion circuit 901. In (a) and (B) of FIG. 16, the vertical axis represents voltage as an analog output while the horizontal axis represents time. FIG. 16(*a*) corresponds to when the image capture target is bright, while FIG. 16(*b*) corresponds to when the image capture target is dark. The reference voltage (ramp waveform) output from the D/A conversion circuit 901 has a downwardly ramping waveform. Here, high voltage is dark-environment voltage while low voltage is bright-environment voltage. An analog-to-digital conversion circuit in an image sensor performs A/D conversion by detecting the time when the voltage of each pixel signal read out of a pixel unit and the voltage of a ramp waveform cross each other with a comparator, and outputting the count value of a counter operating with a predetermined clock signal at this time as a digital value. In FIG. 16(*b*), the analog gain of the camera is increased as compared to FIG. 16(*a*). Specifically, the analog gain is increased by decreasing the inclination of the ramp waveform as illustrated in FIG. 16(*b*).

There is, however, a manufacturing variation in the actual circuit characteristics of the pre-charge circuit 905. For example, there is a manufacturing variation in the threshold voltage of the transistor forming the pre-charge circuit 905. In particular, a manufacturing variation is more likely to be present when the transistor size is smaller than when the transistor size is large.

Figure 17:
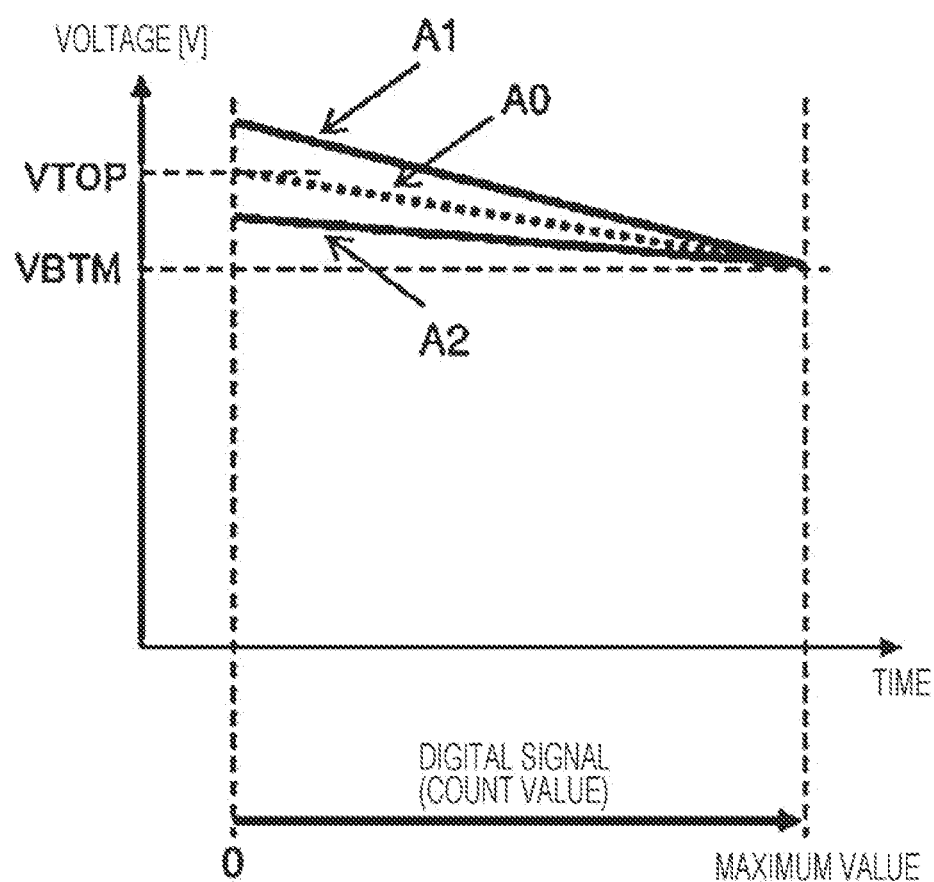
FIG. 17 is an explanatory diagram illustrating variations in conversion characteristics of the D/A conversion circuit.

FIG. 17 is an explanatory diagram illustrating variations in conversion characteristics of the pre-charge circuit 905. In FIG. 17, like (a) and (b) of FIG. 16, the vertical axis represents voltage as an analog output while the horizontal axis represents time. The horizontal axis also corresponds to the count value of the digital signal. A broken line A0 in FIG. 17 is the same as FIG. 16(*b*) and indicates a waveform in a case where there is no shift (offset) due to a manufacturing variation. A bold line A1 in FIG. 17 indicates a waveform in a case where there is a positive shift (offset) due to a manufacturing variation. A bold line A2 in FIG. 17 indicates a waveform in a case where there is a negative shift (offset) due to a manufacturing variation. If there are variations in the reference signal such as the bold lines A1 and A2, they cause noise in the A/D conversion using the reference signal. This noise appears as noise in an image and deteriorates its image quality.

Further, due to a demand on the cost of solid-state imaging devices, the pre-charge circuit 905 needs to be formed smaller in area than the buffer circuit 913, which transmits the base voltage VTOP. Specifically, the size of the transistor forming the pre-charge circuit 905 needs to be smaller than the size of the transistor forming the buffer circuit 913. Accordingly, the pre-charge circuit 905 tends to have a larger manufacturing variation than that of the buffer circuit 913.

This is a serious problem particularly when the analog gain is increased.

As illustrated in FIG. 17, when the analog gain is high, even an error due to a manufacturing variation can be a large error since the dynamic range of the ramp waveform is originally narrow. For example, generally, in the case of a high analog gain of +30 dB, the dynamic range of the ramp waveform is several tens of mV while the manufacturing variation of the pre-charge circuit is several mV or more. That is, the dynamic range may shift by about several tens of percent in the positive and negative directions, and an inappropriate A/D conversion result may be obtained.

To solve the above-described problem, a solid-state imaging device according to an aspect of the present disclosure includes: a pixel unit that outputs a pixel signal corresponding to an amount of incident light; an A/D conversion unit that performs A/D conversion on the pixel signal; and a D/A conversion circuit that generates a reference signal to be used by the A/D conversion unit. The D/A conversion circuit includes a first buffer circuit that outputs a base voltage for generating the reference signal, and the first buffer circuit includes a differential pair circuit including a first transistor and a second transistor, and a suppression circuit that suppresses a variation in the base voltage by canceling out a characteristic difference between the first transistor and the second transistor.

In this way, it is possible to reduce the noise originating from the manufacturing variation of the buffer circuit. Also, since the characteristic difference between the first transistor and the second transistor is canceled out, the size of the first transistor and the size of the second transistor can be reduced.

Note that this comprehensive or specific aspect may be implemented as a system, a method, an integrated circuit, a computer program, or a computer-readable recording medium, such as a CD-ROM, or implemented as any combination of a system, a method, an integrated circuit, a computer program, and a recording medium.

Embodiments will be described in detail below with reference to drawings.

Note that the embodiments to be described below each represent a comprehensive or specific example. The numerical values, shapes, materials, constituent elements, arrangement positions of and forms of connection between the constituent elements, steps, order of the steps, and the like described in the following embodiments are examples and are not intended to limit the present disclosure. Furthermore, among the constituent elements in the following embodiments, the constituent elements not described in the independent claims each representing one mode for carrying out the present disclosure will be described as optional constituent elements. The modes for carrying out the present disclosure are not limited by the current independent claims, and can be expressed by other independent claims.

Embodiment 1

In Embodiment 1, a description will be given of an example of a solid-state imaging device 1 which, in order to cancel the manufacturing variation of its buffer circuit, includes a suppression circuit having a channel switching mechanism using chopper operation.

[1.1 Example of Configuration of Solid-State Imaging Device 1]

First, an example of the configuration of the solid-state imaging device will be described.

Figure 1:
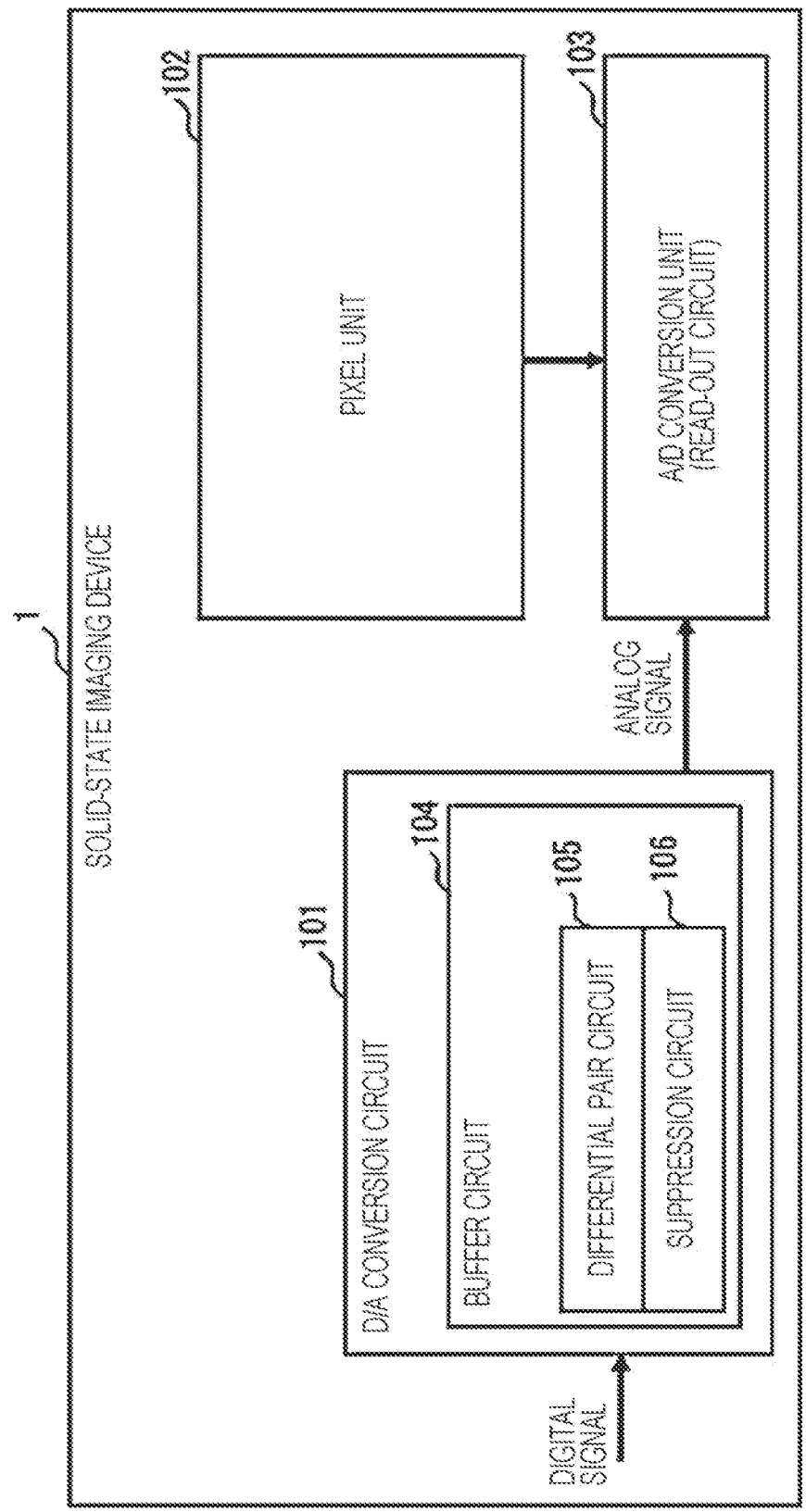
FIG. 1 is a block diagram illustrating an example of the configuration of a solid-state imaging device in Embodiment 1.

FIG. 1 is a block diagram illustrating the example of the configuration of the solid-state imaging device 1 in Embodiment 1.

In FIG. 1, the solid-state imaging device 1 includes a D/A conversion circuit 101, a pixel unit 102, and an A/D conversion unit 103.

The D/A conversion circuit 101 generates a reference signal to be used by the A/D conversion unit 103. The reference signal has a ramp waveform or a triangular waveform. The D/A conversion circuit 101 includes a buffer circuit 104 that outputs a base voltage for generating the reference signal.

The pixel unit 102 outputs pixel signals each corresponding to an amount of incident light.

The A/D conversion unit 103 performs analog-to-digital (ND) conversion on the pixel signals output from the pixel unit 102.

The buffer circuit 104 includes a differential pair circuit 105 and a suppression circuit 106.

The differential pair circuit 105 is a differential amplifier (so-called op amp) having a transistor pair including a first transistor and a second transistor, and is used as a buffer.

The suppression circuit 106 cancels out the characteristic difference between the first transistor and the second transistor to thereby suppress variation in the base voltage for generating the reference signal. This can reduce the noise originating from the manufacturing variation of the buffer circuit.

Next, a more specific example of the configuration of the solid-state imaging device 1 will be described.

Figure 2:
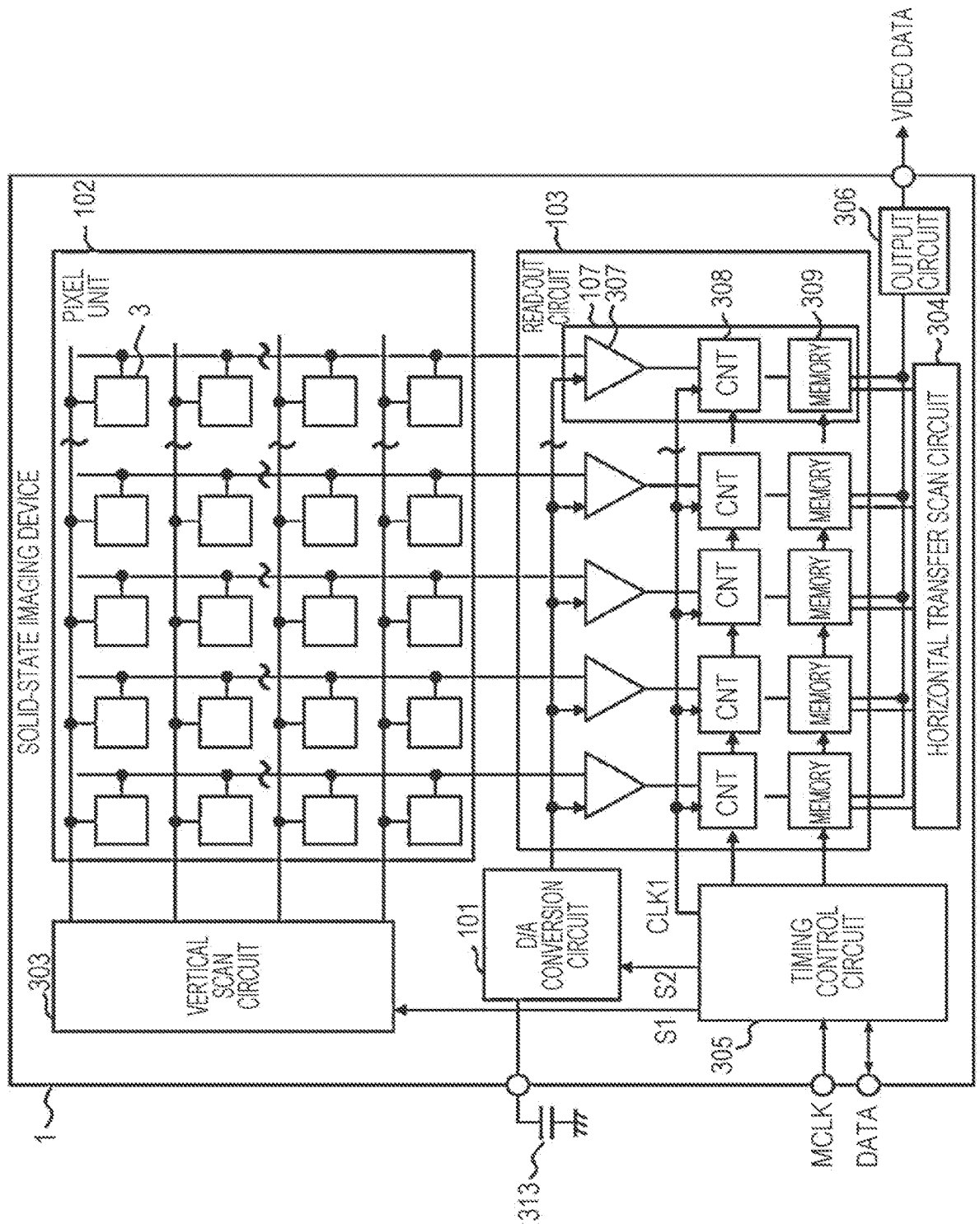
FIG. 2 is a block diagram illustrating a more specific example of the configuration of the solid-state imaging device in Embodiment 1.

FIG. 2 is a block diagram illustrating the more specific example of the configuration of the solid-state imaging device 1 in Embodiment 1.

In FIG. 2, the solid-state imaging device 1 is a CMOS image sensor and includes the D/A conversion circuit 101, the pixel unit 102, the A/D conversion unit (read-out circuit) 103, a vertical scan circuit (row scan circuit) 303, a horizontal transfer scan circuit (column scan circuit) 304, a timing control circuit 305, and an output circuit 306.

The D/A conversion circuit 101 generates the reference signal to be used by the A/D conversion unit 103. The D/A conversion circuit 101 includes the buffer circuit 104, as illustrated in FIG. 1. As already described, the buffer circuit 104 includes the differential pair circuit 105 and the suppression circuit 106. Note that a capacitive element 313 provided outside the solid-state imaging device 1 is connected to the D/A conversion circuit 101.

The pixel unit 102 is an imaging unit in which a plurality of pixel circuits 3 that perform photoelectric conversion are arranged in a matrix.

The read-out circuit (A/D conversion unit) 103 has an A/D conversion circuit 107 provided for each column, and reads out pixel signals from the pixel unit 102 in units of a plurality of pixel circuits and performs A/D conversion on the read pixel signals.

Each A/D conversion circuit 107 has a comparator 307, a counter 308, and a digital memory 309.

The comparator 307 compares the reference voltage from the D/A conversion circuit 101 and the potential of each analog pixel signal output from the corresponding column of pixel circuits 3 with each other, and inverts its output signal if they match each other.

The counter 308 is a circuit that counts the time of the comparison at the corresponding comparator 307, and stops the counting when the output signal of this comparator 307 is inverted. The count value at the point when the counting is stopped is a digital pixel signal corresponding to the analog pixel signal.

The digital memory 309 holds the count value of the corresponding counter 308. This count value is the digitalized pixel signal.

The vertical scan circuit (row scan circuit) 303 scans the pixel circuits 3 on a row-by-row basis. By this scan, the exposure of each pixel circuit 3 to light and the output of its pixel signal are controlled.

The horizontal transfer scan circuit (column scan circuit) 304 scans the A/D conversion circuits 107 on a column-by-column basis. Specifically, the horizontal transfer scan circuit 304 selects the digital pixel signals held in the digital memories 309 on a column-by-column basis.

The timing control circuit 305 controls the operation timings of the D/A conversion circuit 101, the A/D conversion unit 103, and the vertical scan circuit 303.

The output circuit 306 is an output buffer that externally outputs the digital pixel signals selected by the horizontal transfer scan circuit 304.

Next, an example of the configuration of the D/A conversion circuit 101 will be described.

Figure 3:
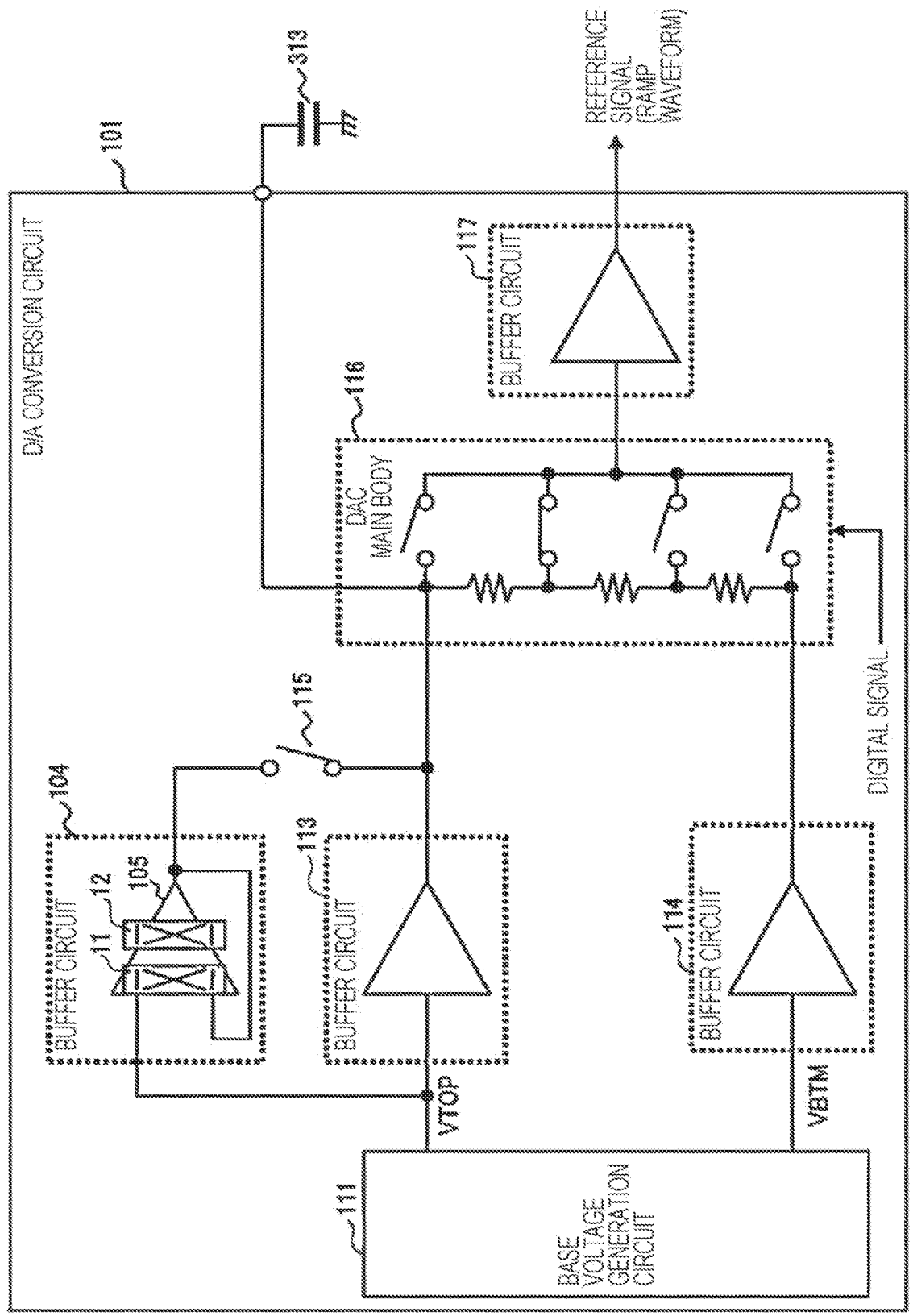
FIG. 3 is a block diagram illustrating an example of the configuration of a D/A conversion circuit in Embodiment 1.

FIG. 3 is a block diagram illustrating the example of the configuration of the D/A conversion circuit 101 in Embodiment 1.

The D/A conversion circuit 101 in FIG. 3 includes the buffer circuit 104, a buffer circuit 113, a buffer circuit 114, a base voltage generation circuit 111, a switch 115, a DAC main body 116, and a buffer circuit 117. Note that the capacitive element 313 externally connected to the solid-state imaging device 1 is connected to the output line of the buffer circuit 113.

The buffer circuit 104 represents an example of a pre-charge circuit that pre-charges, to a base voltage VTOP, the capacitive element 313 externally connected to the D/A conversion circuit 101. This buffer circuit 104 includes the differential pair circuit 105, a first circuit 11, and a second circuit 12. The differential pair circuit 105 is a differential amplifier (so-called op amp) to be used as a buffer. The first circuit 11 and the second circuit 12 form the suppression circuit 106 illustrated in FIG. 1. The first circuit 11 and the second circuit 12 are configured as a channel switching mechanism for alternately and repetitively switching the connection relationships of the first transistor and the second transistor in the differential pair circuit 105. The first circuit 11 performs a chopper operation of alternately and repetitively switching differential signals on the input side of the differential pair circuit 105. The second circuit 12 performs a chopper operation of alternately and repetitively switching the differential signals on the output side of the differential pair circuit 105. Here, "on the input side of the differential pair circuit 105" means "being input into the differential pair circuit 105" or "being inside the differential pair circuit 105". Moreover, "on the output side of the differential pair circuit 105" means "being output from the differential pair circuit 105" or "being inside the differential pair circuit 105 and after the first circuit 11". The above first circuit 11 and second circuit 12 perform their alternately and repetitively switching chopper operations with the same timing.

The base voltage generation circuit 111 generates the base voltage VTOP and a base voltage VBTM.

The buffer circuit 113 buffers the base voltage VTOP generated by the base voltage generation circuit 111 and outputs it to the DAC main body 116.

The buffer circuit 114 buffers the base voltage VBTM generated by the base voltage generation circuit 111 and outputs it to the DAC main body 116.

The switch 115 is a switch that turns on and off the pre-charge of the capacitive element 313 by the buffer circuit 104.

The DAC main body 116 has a resistor ladder into which the base voltage VTOP and the base voltage VBTM are input, and a group of switches which are turned on and off in accordance with an input digital signal. With this configuration, the DAC main body 116 outputs a reference voltage (ramp waveform) to be used in A/D conversion at a subsequent stage by generating a voltage corresponding to the digital signal within the range from the base voltage VTOP to the base voltage VBTM.

The buffer circuit 117 buffers and outputs the reference signal generated by the DAC main body 116.

Next, an example of the timing of the pre-charge of the capacitive element 313 by the buffer circuit 104 will be described.

FIG. 4 is a time chart illustrating the reference signal (ramp waveform) and a pre-charge period in Embodiment 1.

FIG. 4 illustrates the voltage waveform (ramp waveform) of the reference signal and a waveform indicating the on-off operation of the switch 115 in 2H (2 horizontal scans) periods.

In each 1H period, each A/D conversion circuit 107 performs A/D conversion twice in order to perform correlated double sampling (CDS). For this reason, the reference signal in each 1H period has a RST (reset) level A/D conversion period and a signal level A/D conversion period for the two A/D conversions.

The switch 115 is turned on at the start of each 1H period and is turned off upon the elapse of a pre-charge period. The period in which the switch 115 is on is the pre-charge period, during which the capacitive element 313 is pre-charged by the buffer circuit 104 to the base voltage VTOP.

[1.2 Example of Configuration of Buffer Circuit 104]

Next, a more detailed example of the configuration of the buffer circuit 104 will be described.

Figure 5:
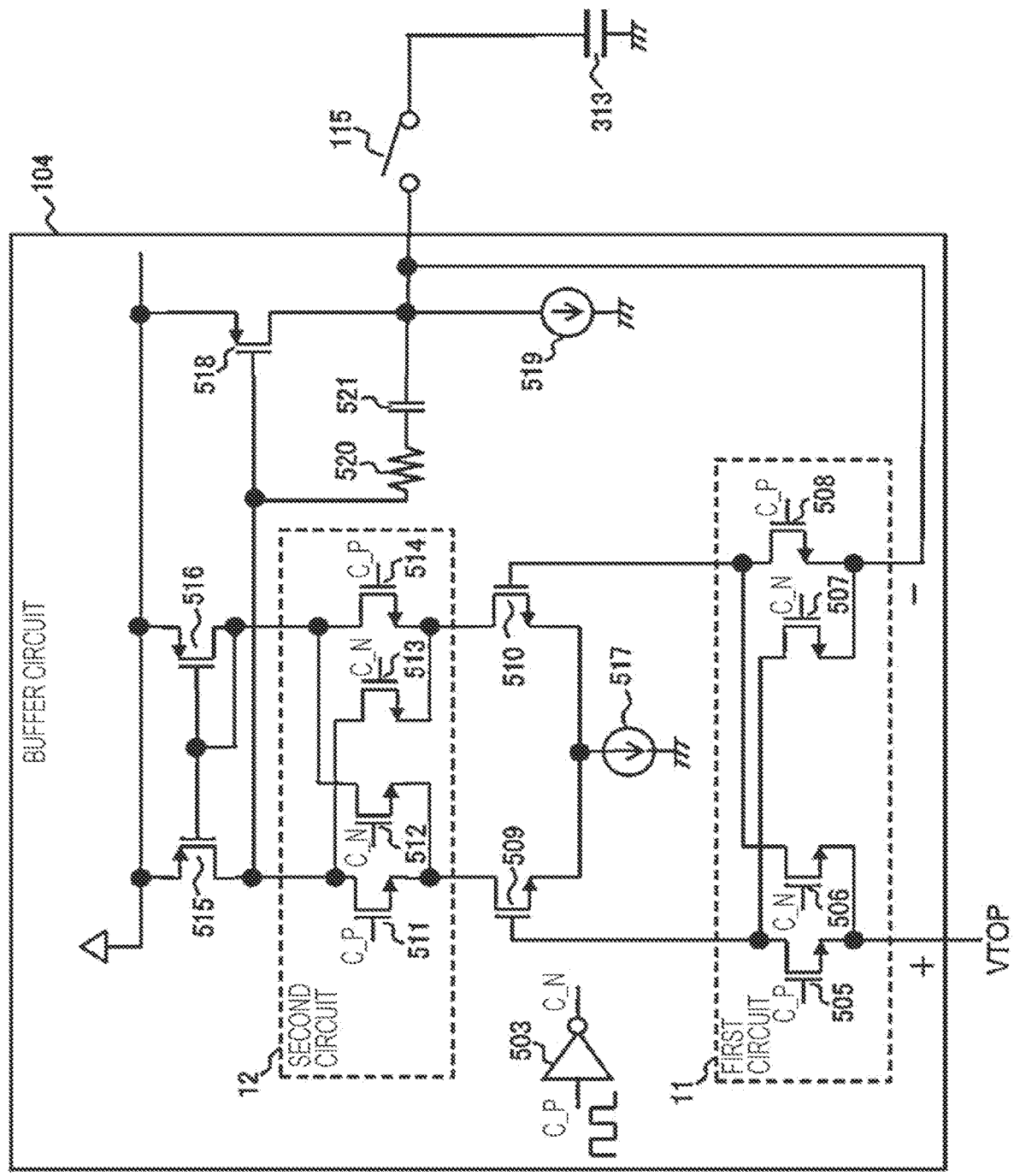
FIG. 5 is a circuit diagram illustrating a more detailed example of the configuration of a buffer circuit in Embodiment 1.

FIG. 5 is a circuit diagram illustrating a more detailed example of the configuration of the buffer circuit 104 in Embodiment 1.

The buffer circuit 104 in FIG. 5 includes, as the differential pair circuit 105, a first transistor 509, a second transistor 510, a transistor 515, a transistor 516, a current source 517, a transistor 518, a current source 519, a resistor 520, and a capacitive element 521. This differential pair circuit 105 represents an example of a two-stage amplifier configuration including a differential amplification circuit as a first-stage amplifier and a source follower circuit as a second-stage amplifier.

The buffer circuit 104 further includes, as the suppression circuit 106, an inverter 503, the first circuit 11, and the second circuit 12. This suppression circuit 106 functions as a channel switching mechanism that performs chopper operation. This channel switching mechanism is included in the first-stage amplifier of the two-stage amplifier configuration in the differential pair circuit 105.

The inverter 503 supplies a clock signal for the chopper operation to the first circuit 11 and the second circuit 12. There are two types of clock signals that are non-inverted clock signal C_P and inverted clock signal C_N. The non-inverted clock signal C_P and the inverted clock signal C_N have phases differing by 180 degrees, that is, are inverted relative to each other.

The first circuit 11 has four NMOS transistors 505 to 508 and forms the channel switching mechanism on the input side of the first-stage amplifier. This first circuit 11 has two input terminals and two output terminals, and switches the connection of the two input terminals with the two output terminals between straight connection and crossed connection.

The second circuit 12 has four NMOS transistors 511 to 514 and forms the channel switching mechanism on the output side of the first-stage amplifier. This second circuit 12 has two input terminals and two output terminals, and switches the connection of the two input terminals with the two output terminals between straight connection and crossed connection. Note that the transistors 511 to 514 may be given an additional role as cascode transistors to also contribute to increasing the gain of the whole first-stage amplifier.

When the non-inverted clock signal C_P is H (high level), the transistors 505, 508, 511, and 514 are on and the transistors 506, 507, 512, and 513 are off. Specifically, the positive input terminal of the first-stage amplifier, to which the base voltage VTOP is input, and the gate of the transistor 509 are connected, and the negative input terminal of the first-stage amplifier and the gate of the transistor 510 are connected. In other words, the first circuit 11 and the second circuit 12 are both in the state of straight connection.

On the other hand, when the non-inverted clock signal C_P is L (low level), the transistors 506, 507, 512, and 513 are on and the transistors 505, 508, 511, and 514 are in off. Specifically, the positive input terminal of the first-stage amplifier, to which the base voltage VTOP is input, and the gate of the transistor 510 are connected, and the negative input terminal of the first-stage amplifier and the gate of the transistor 509 are connected. That is, the relationship is exactly the opposite to when C_P is H. In other words, the first circuit 11 and the second circuit 12 are both in the state of crossed connection.

Each time the non-inverted clock signal C_P is inverted, the connection relationships are switched while the buffer circuit 104 still operates as a buffer, and its output is accumulated into the external capacitive element 313 via the switch 115. Specifically, even if there is a variation between the input differential pair formed of the first transistor 509 and the second transistor 510, their average value is accumulated into the capacitive element 313. The input differential pair is dominant in the variation of the buffer circuit 104. Thus, the channel switching mechanism formed of the first circuit 11 and the second circuit 12 in FIG. 5 exhibits a strong variation canceling effect.

Note that although NMOS transistors are used in the example of the configuration of the buffer circuit 104 in FIG. 5, PMOS transistors may be used or CMOS transistors may be used.

Next, the variation canceling effect will be described.

Figure 6:
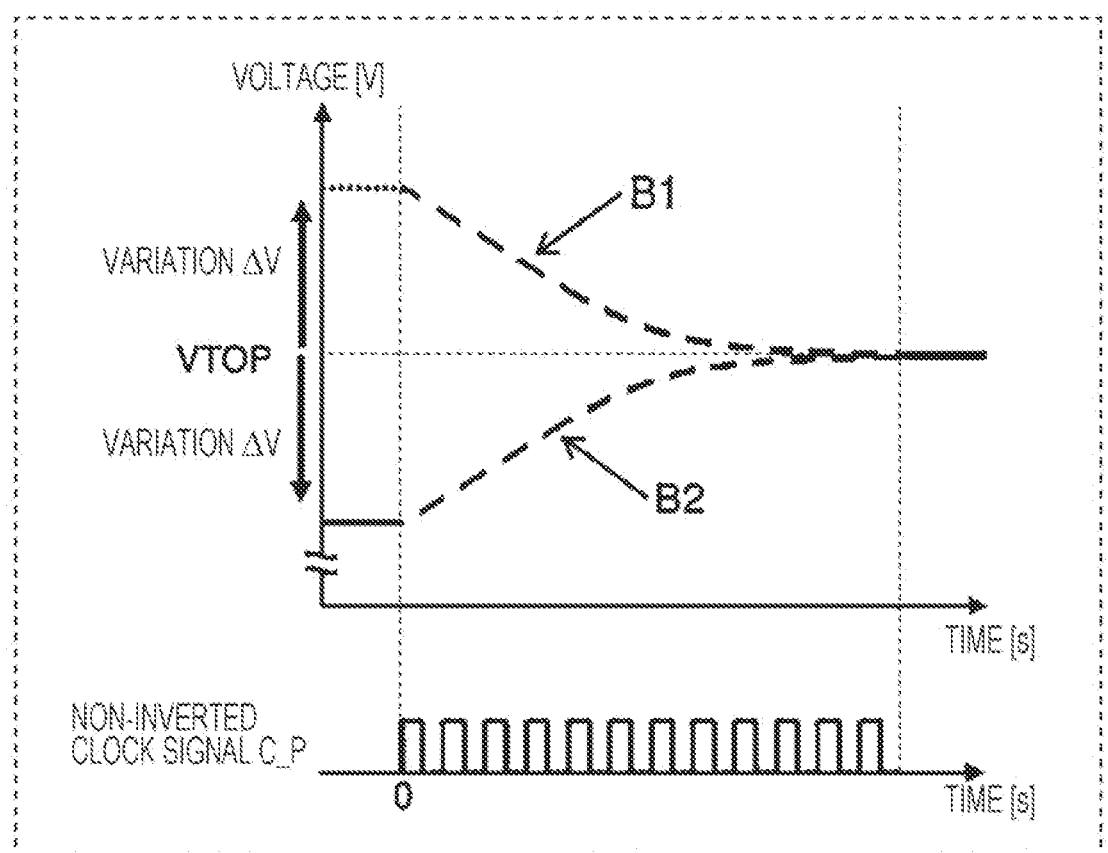
FIG. 6 is an explanatory diagram illustrating chopper operation of the buffer circuit in Embodiment 1.

FIG. 6 is an explanatory diagram illustrating the chopper operation of the buffer circuit 104 in Embodiment 1. In FIG. 6, the horizontal axis represents time while the vertical axis represents the output voltage from the buffer circuit 104 and the signal waveform of the non-inverted clock signal C_P. ΔV denotes the shift (offset) in the output voltage due to the variation of the input differential pair. As indicated by broken lines B1 and B2 in FIG. 6, the canceling effect on the offset ΔV of the output voltage from the buffer circuit 104 becomes stronger as the chopper operation with the non-inverted clock signal C_P progresses, and the output voltage is finally averaged to the base voltage VTOP.

Improvement of the A/D conversion characteristics of the solid-state imaging device 1 will further be described.

Figure 7:
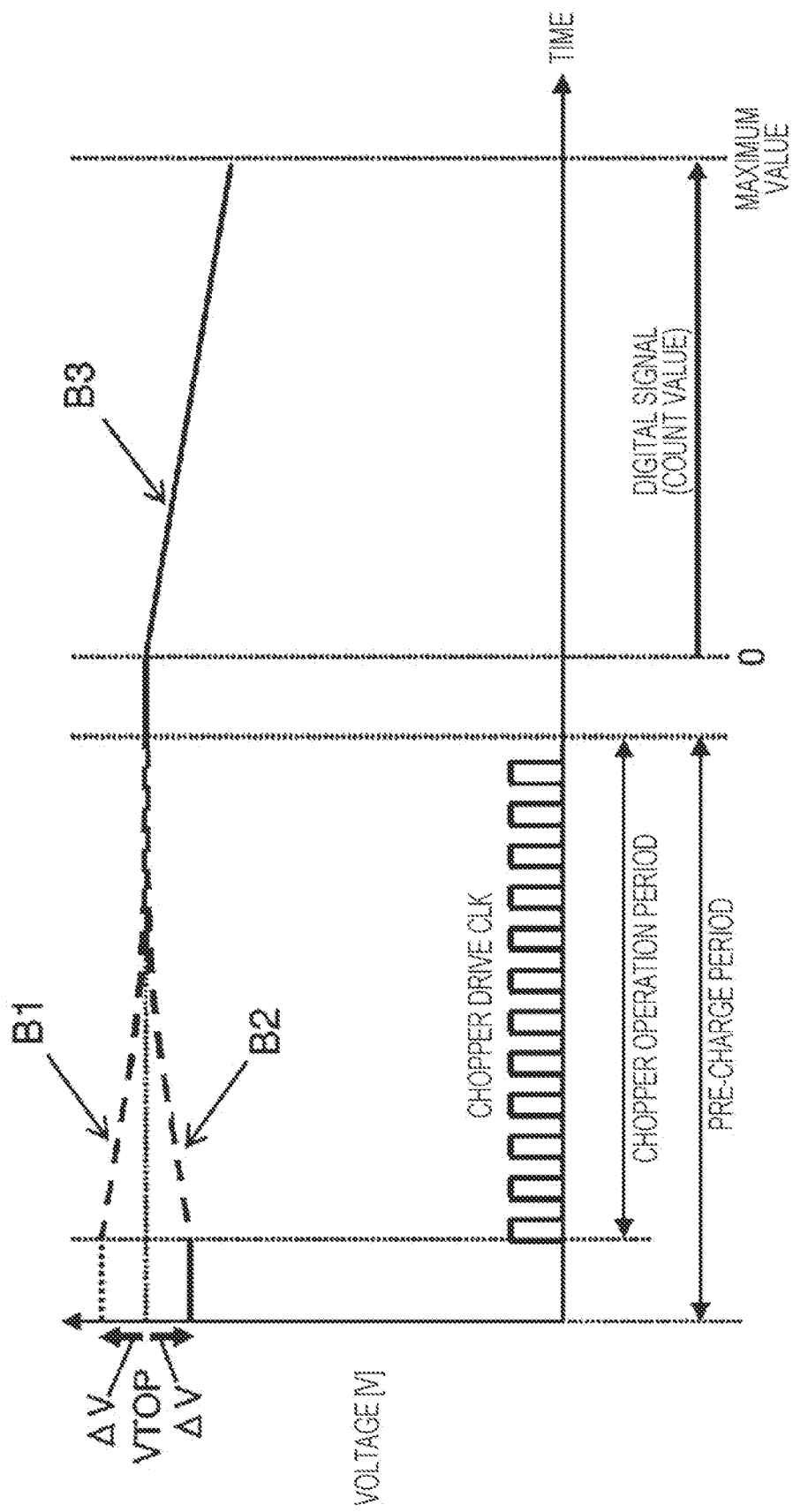
FIG. 7 is an explanatory diagram illustrating the chopper operation of the buffer circuit and a ramp waveform in Embodiment 1.

FIG. 7 is an explanatory diagram illustrating the chopper operation of the buffer circuit 104 and the ramp waveform in Embodiment 1. The horizontal axis and the vertical axis in FIG. 7 are the same as those in FIG. 6. As illustrated in FIG. 7, the suppression circuit 106 is capable of canceling out the variation with the chopper operation (broken lines B1 and B2) before shifting to the actual A/D conversion operation (the ramp waveform with a solid line B3). Performing the actual A/D conversion with the chopper operation stopped makes it possible to obtain A/D conversion characteristics with the variation reduced, which are close to the ideal characteristics.

Next, the result of a simulation of the A/D conversion by the solid-state imaging device 1 will be described.

Figure 8:
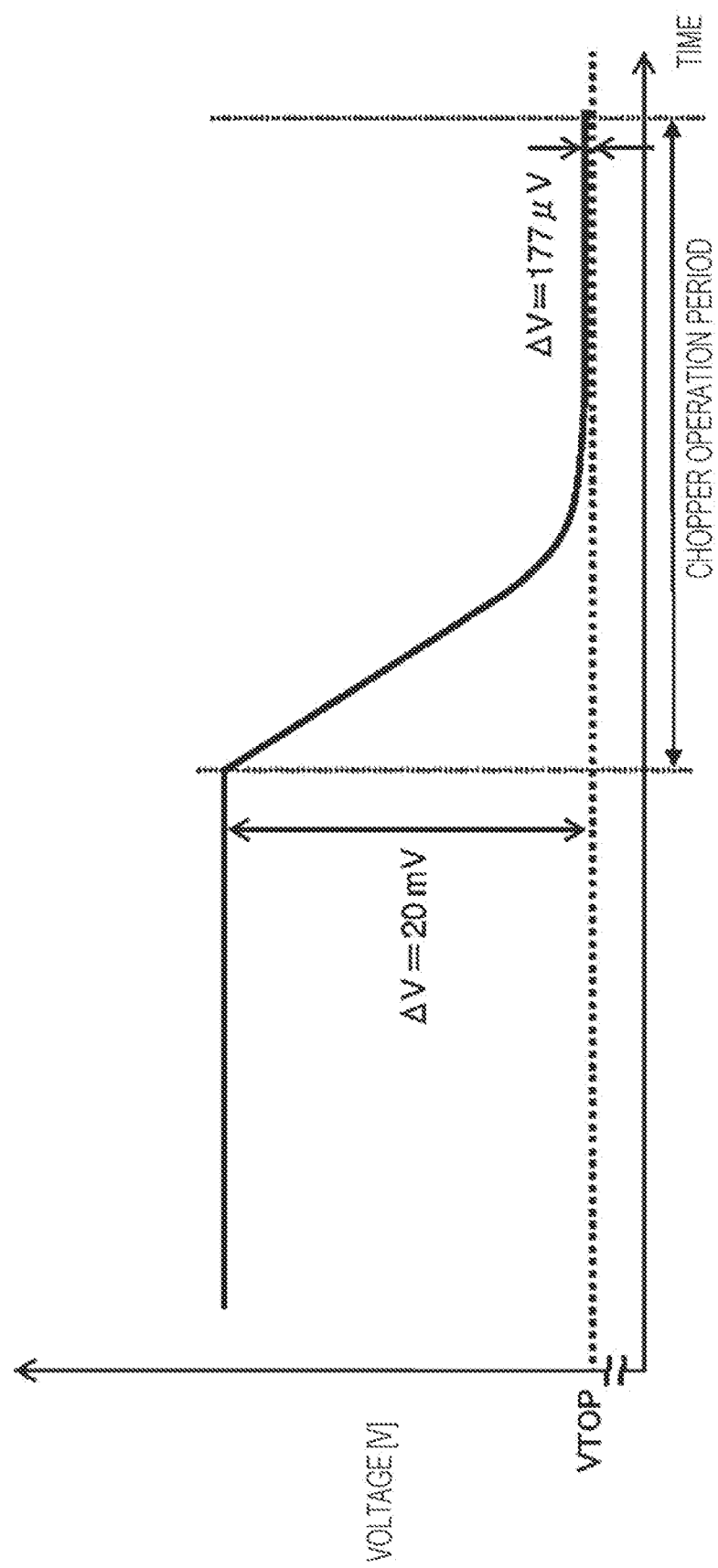
FIG. 8 is an explanatory diagram illustrating an example of the result of a simulation of the buffer circuit in Embodiment 1.

FIG. 8 is an explanatory diagram illustrating an example of the result of the simulation of the buffer circuit 104 in Embodiment 1. In FIG. 8, the horizontal axis represents time while the vertical axis represents the output voltage from the buffer circuit 104. In this simulation example, an offset ΔV of 20 mV appears before the start of the chopper operation of the suppression circuit 106. As the chopper operation period elapses, the offset ΔV is averaged so as to decrease. By the end of the chopper operation period, the offset ΔV has decreased to 177 μV, and the original offset ΔV has therefore been strongly canceled. As described above, the suppression circuit 106 is capable of significantly reducing the noise originating from the manufacturing variation of the input differential pair. Also, since the characteristic difference between the first transistor and the second transistor (e.g., variation in threshold voltage Vt) is canceled out, the presence of the characteristic difference between the first transistor and the second transistor can be proactively tolerated, in other words, the size of the first transistor and the size of the second transistor can be reduced. The size of the first transistor and the size of the second transistor may be smaller than the size of the transistors forming the buffer circuit 113 or the buffer circuit 114, and may be ½ or less, for example. The size of the first transistor and the size of the second transistor may be smaller than the size of the transistors forming the differential pair circuit in the buffer circuit 113, and may be ½ or less, for example. The size of the first transistor and the size of the second transistor may be smaller than the size of the transistors forming the differential pair circuits in the other buffer circuits included in the D/A conversion circuit 101, i.e., the buffer circuit 113, the buffer circuit 114, and the buffer circuit 117, and may be ½ or less, for example. The "size of the transistor" here means the product of the gate width and the gate length.

As mentioned above, a solid-state imaging device 1 according to Embodiment 1 includes: a pixel unit 102 that outputs a pixel signal corresponding to an amount of incident light; an A/D conversion unit 103 that performs A/D conversion on the pixel signal; and a D/A conversion circuit 101 that generates a reference signal to be used by the A/D conversion unit. The D/A conversion circuit 101 includes a buffer circuit 104 that outputs a base voltage VTOP for generating the reference signal, and the buffer circuit 104 includes a differential pair circuit 105 including a first transistor 509 and a second transistor 510, and a suppression circuit 106 that suppresses a variation in the base voltage by canceling out a characteristic difference between the first transistor 509 and the second transistor 510.

This can reduce the noise originating from the manufacturing variation of the buffer circuit. Also, since the characteristic difference between the first transistor and the second transistor is canceled out, the size of the first transistor and the size of the second transistor can be reduced.

The suppression circuit 106 alternately and repetitively may switche connection relationships of the first transistor 509 and the second transistor 510 in the differential pair circuit 105.

By alternately and repetitively switching the above connection relationships, the variation is averaged. Specifically, by averaging the variation, the above characteristic difference can be canceled out.

The differential pair circuit 105 may receive differential signals corresponding to the base voltage VTOP, the suppression circuit 106 may include a first circuit 11 that alternately and repetitively switches the differential signals on an input side of the differential pair circuit 105, and a second circuit 12 that alternately and repetitively switches the differential signals on an output side of the differential pair circuit 105, and the first circuit 11 and second circuit 12 may perform alternately and repetitively switching operations with same timing.

In this way, the first circuit is inserted on the input side of the differential pair circuit, and the second circuit is inserted on the output side of the differential pair circuit. With the first circuit and the second circuit, the above connection relationships can alternately and repetitively switched.

The first circuit 11 may have two input terminals and two output terminals, and switch connection of the two input terminals with the two output terminals between straight connection and crossed connection, and the second circuit 12 may have two input terminals and two output terminals, and switch connection of the two input terminals with the two output terminals between straight connection and crossed connection.

In this way, the first circuit and the second circuit can be easily configured as switch circuits that switch between straight connection and crossed connection.

Sizes of the first transistor 509 and the second transistor 510 may be smaller than a size of another transistor in the D/A conversion circuit 101.

In this way, the circuit area occupied by the buffer circuit can be made small, which can reduce the circuit cost of the buffer circuit.

The buffer circuit 104 may be a pre-charge circuit that pre-charges, to the base voltage VTOP, a capacitive element 313 externally connected to the D/A conversion circuit 101.

In this way, with the pre-charge by the buffer circuit, it is possible to reduce the processing time of A/D conversion performed a plurality of times in the solid-state imaging device. That is, the speed of the imaging operation of the solid-state imaging device is easily increased.

The D/A conversion circuit 101 may include a buffer circuit 113 connected in parallel to the buffer circuit 104, and the buffer circuit 113 may or may not include the suppression circuit 106.

In this way, the noise originating from the manufacturing variation of the buffer circuit can be effectively reduced with a simple circuit configuration.

The D/A conversion circuit 101 may include a plurality of buffer circuits including the buffer circuit 104, and the buffer circuits other than the buffer circuit 104 among the plurality of buffer circuits, in other words, buffer circuit 113, buffer circuit 114 and, buffer circuit 117 may or may not include the suppression circuit 106.

In this way, the noise originating from the manufacturing variation of the buffer circuit can be effectively reduced with a simple circuit configuration.

The D/A conversion circuit 101 may include a buffer circuit 113 connected in parallel to the buffer circuit 104, and sizes of the first transistor 509 and the second transistor 510 may be smaller than a size of a transistor forming a differential pair circuit in the buffer circuit 113.

In this way, the circuit area occupied by the buffer circuit can be made small, which can reduce the circuit cost of the buffer circuit.

The D/A conversion circuit 101 may include a plurality of buffer circuits including the buffer circuit 104, and sizes of the first transistor 509 and the second transistor 510 may be smaller than a size of a transistor forming a differential pair circuit in the buffer circuits, in other words, buffer circuit 113, buffer circuit 114 and, buffer circuit 117, other than the buffer circuit 104 among the plurality of buffer circuits.

In this way, the circuit area occupied by the buffer circuit can be made small, which can reduce the circuit cost of the buffer circuit.

Embodiment 2

In Embodiment 1, a description has been given of an example of a solid-state imaging device which, in order to cancel the manufacturing variation of its buffer circuit, includes the suppression circuit 106 having a channel switching mechanism using chopper operation. In Embodiment 2, a description will be given of an example of a solid-state imaging device which, in order to cancel the manufacturing variation of its buffer circuit, includes an auto-zero circuit, as the suppression circuit 106, that cancels the offset at the input differential pair.

[2.1 Example of Configuration of Solid-State Imaging Device 1]

The configuration of a solid-state imaging device 1 in Embodiment 2 is similar to FIGS. 1 and 2 presented in Embodiment 1. However, the configuration of the suppression circuit 106 in the D/A conversion circuit 101 is different. The difference will be mainly described below.

Figure 9:
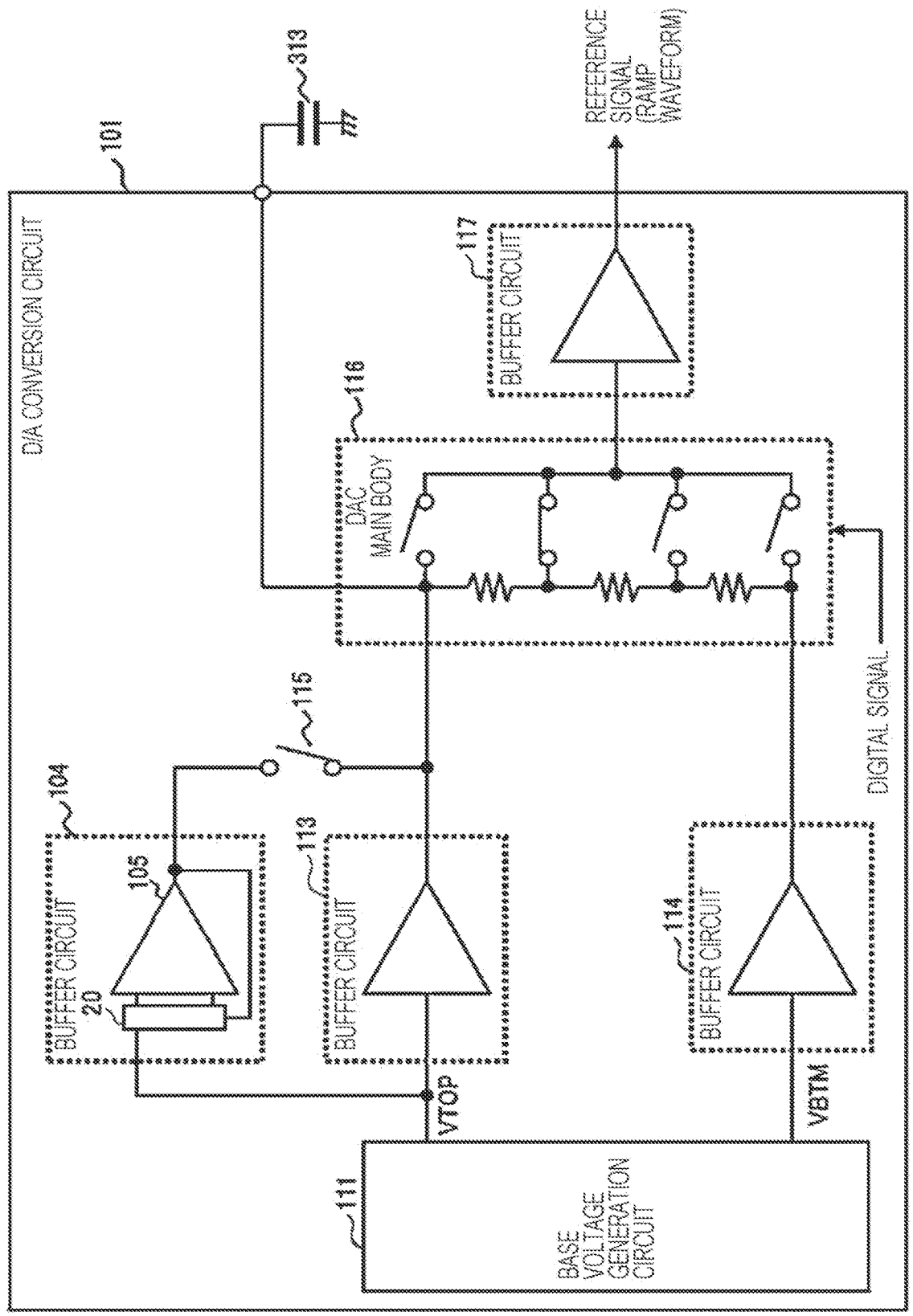
FIG. 9 is a block diagram illustrating an example of the configuration of a D/A conversion circuit in Embodiment 2.

FIG. 9 is a block diagram illustrating an example of the configuration of the D/A conversion circuit 101 in Embodiment 2.

FIG. 9 differs from FIG. 3 in that the buffer circuit 104 includes an auto-zero circuit 20 in place of the first circuit 11 and the second circuit 12, in other words, the buffer circuit 104 includes the auto-zero circuit 20 as the suppression circuit 106. The difference will be mainly described below.

The auto-zero circuit 20 is a circuit that cancels the offset occurring at the differential pair circuit 105.

Figure 10:
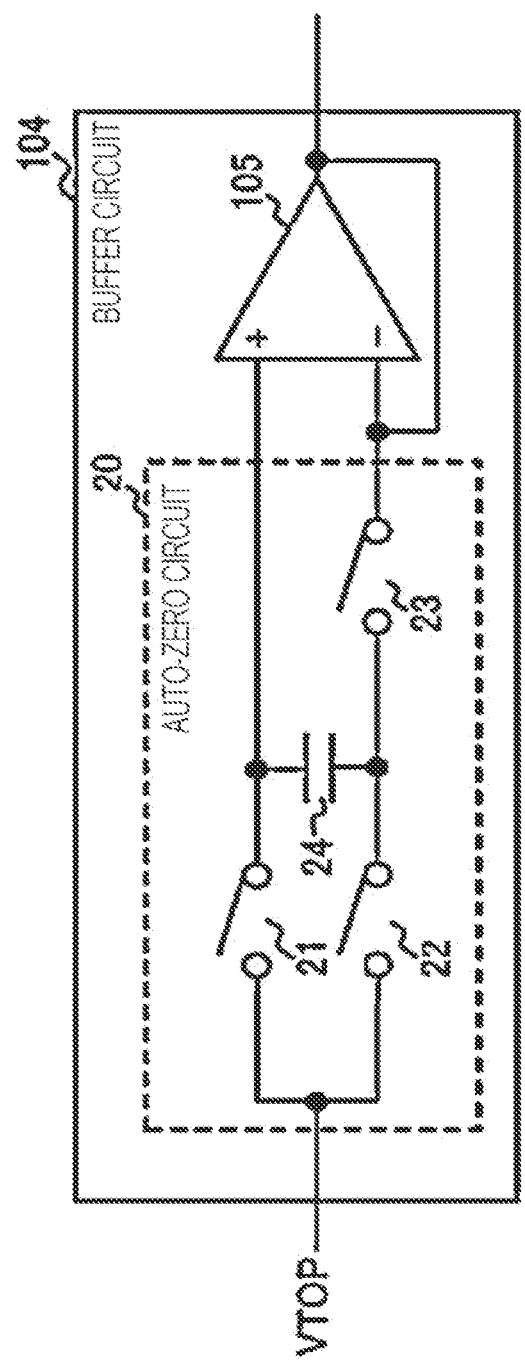
FIG. 10 is a block diagram of a buffer circuit including an example of the configuration of an auto-zero circuit in Embodiment 2.

FIG. 10 is a block diagram of the buffer circuit 104 including an example of the configuration of the auto-zero circuit 20 in Embodiment 2.

As illustrated in FIG. 10, the auto-zero circuit 20 includes switches 21 to 23 and a capacitive element 24, and operates in an offset sampling mode and an offset canceling mode.

Next, the offset sampling mode and the offset canceling mode will be described using FIGS. 11 and 12. Note that in the following description, expressions such as (ON, OFF, ON) mean the states of the respective switches 21, 22, and 23 in the order mentioned.

Figure 11:
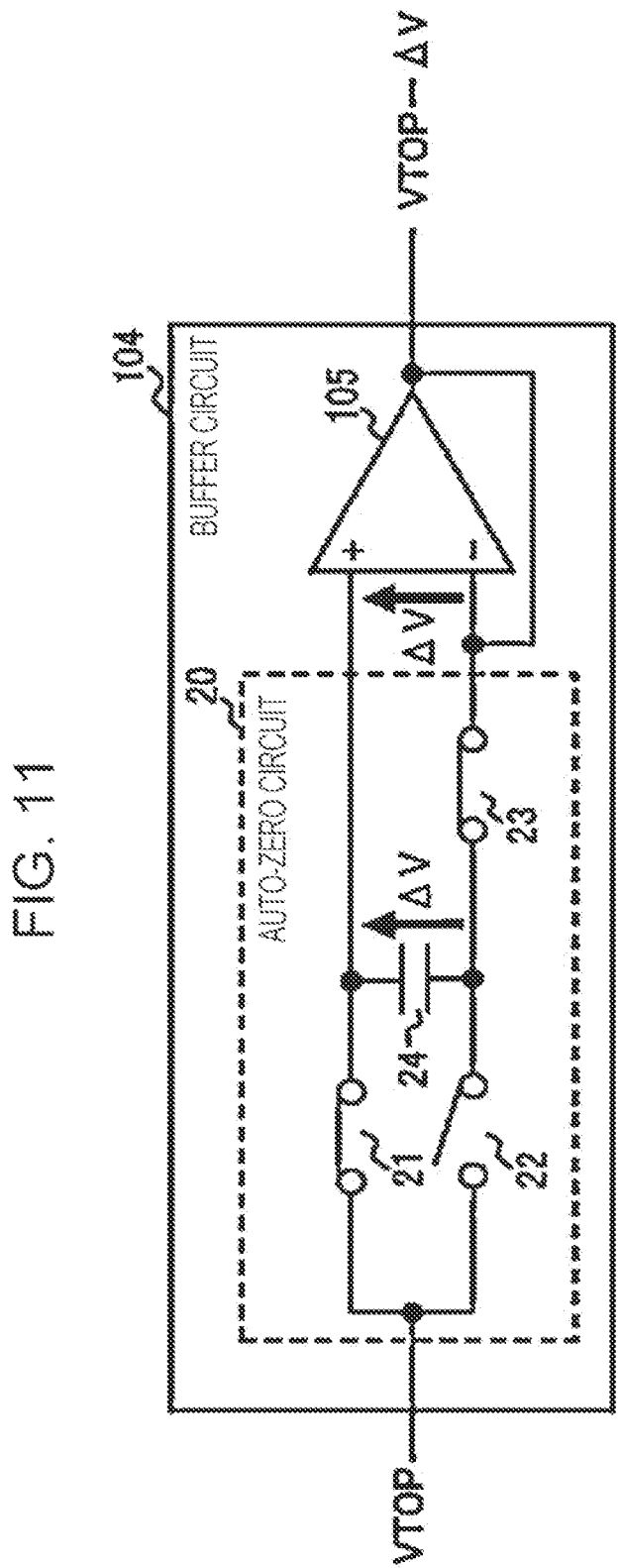
FIG. 11 is an explanatory diagram illustrating an offset sampling mode of the auto-zero circuit in Embodiment 2.

FIG. 11 is an explanatory diagram illustrating the offset sampling mode of the auto-zero circuit 20 in Embodiment 2.

In the offset sampling mode, the switches 21 to 23 are in an (ON, OFF, ON) state, so that an offset ΔV is sampled to the capacitive element 24. The offset ΔV is a shift voltage generated between the non-inverting input terminal of the differential pair circuit 105 and the inverting input terminal of the differential pair circuit 105 connected to its output terminal. Essentially, the offset is ideally 0 V but occurs due to the manufacturing variation of the input differential pair in the differential pair circuit 105. Here, the output of the differential pair circuit 105 is affected by ΔV and thereby becomes a voltage (VTOP−ΔV) lower than the base voltage VTOP by the offset ΔV. In the capacitive element 24, an offset voltage ΔV with the polarity indicated by the arrow in FIG. 11 is sampled, i.e., held. Note that the switch 115 connected to the output terminal is preferably off at this time from the viewpoint of disconnecting the load, but does not necessarily have to be off.

Figure 12:
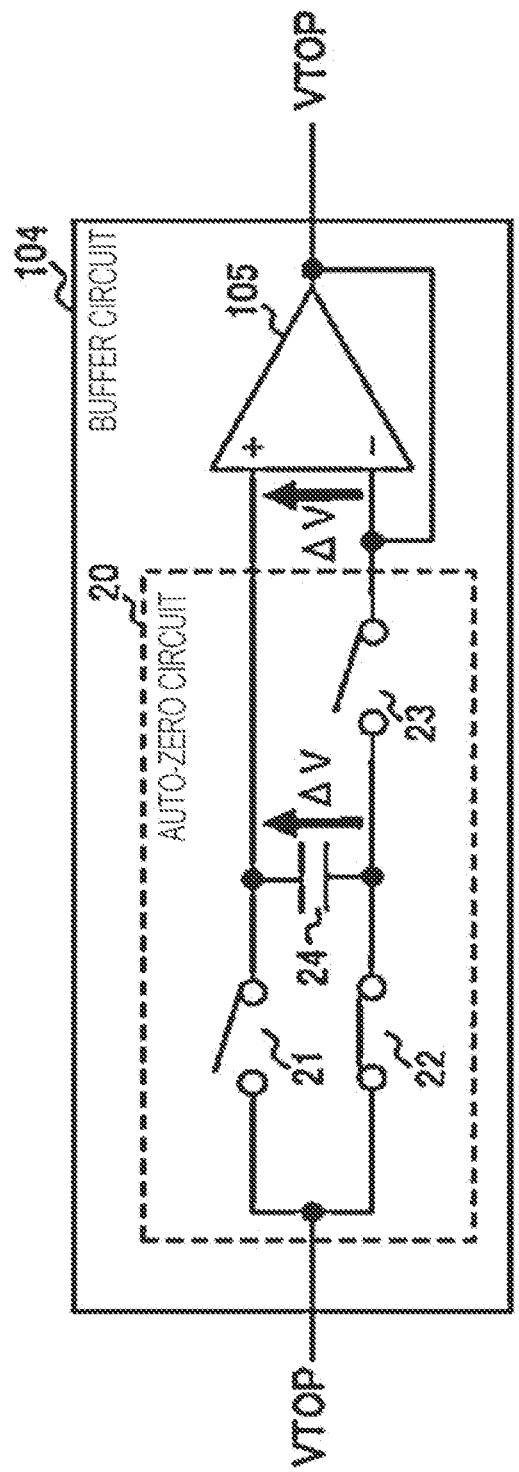
FIG. 12 is an explanatory diagram illustrating an offset canceling mode of the auto-zero circuit in Embodiment 2.

FIG. 12 is an explanatory diagram illustrating the offset canceling mode of the auto-zero circuit 20 in Embodiment 2.

In the offset canceling mode, the switches 21 to 23 are in an (OFF, ON, OFF) state, so that the offset ΔV sampled in the capacitive element 24 is supplied with the polarity opposite to that of the offset ΔV at the differential pair circuit 105. Specifically, a voltage (VTOP+ΔV) obtained by adding the sampled offset ΔV to the base voltage VTOP is supplied to the non-inverting input terminal. As a result, the offset ΔV occurring between the non-inverting input terminal and the inverting input terminal of the differential pair circuit 105 is canceled. At this time, the voltage at the output terminal is the base voltage VTOP. Note that the operation of the switches 21, 22, and 23 needs to be non-overlap operation in which their ON states do not overlap each other simultaneously.

Next, an example of the operation of the auto-zero circuit 20 will be described.

Figure 13:
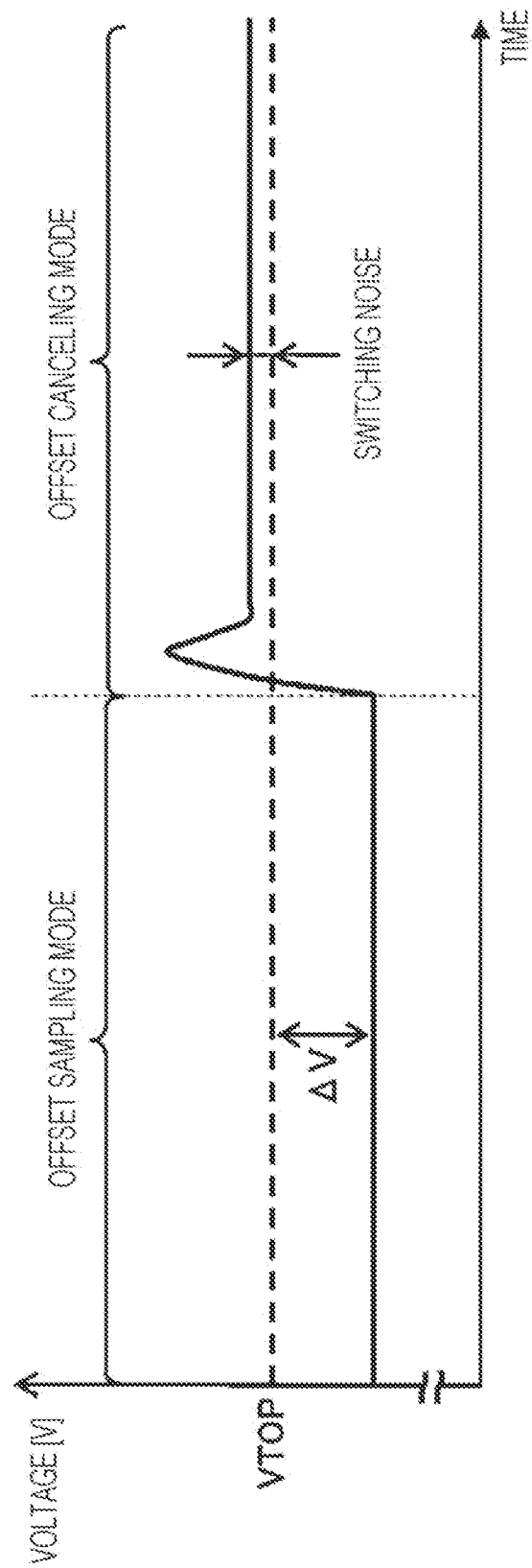
FIG. 13 is a diagram illustrating an example of the output waveform of a differential pair circuit having the auto-zero circuit in Embodiment 2.

FIG. 13 is a diagram illustrating an example of the output waveform of the differential pair circuit 105 having the auto-zero circuit 20 in Embodiment 2. In FIG. 13, the horizontal axis represents time while the vertical axis represents the voltage at the output terminal of the differential pair circuit 105. The broken line represents the base voltage VTOP.

In FIG. 13, first, a voltage having an error of ΔV is output in the offset sampling mode. At the time of switching to the offset canceling mode, switching noise is actually superimposed on the output voltage. The on/off operation of the switches 21 to 23 always cause switching noise, and having zero switching noise is physically impossible. Moreover, due to restrictions on the circuit areas, it may be difficult to ensure a sufficient circuit area for the capacitive element 24, and switching noise as illustrated in FIG. 13 may be an unignorable voltage, e.g., several mV, in the offset canceling mode.

Although causing some switching noise as described above, the auto-zero circuit 20 samples the shift (offset voltage) due to the manufacturing variation and cancels the offset voltage with the sampled voltage. That is, the characteristic difference between the input differential pair in the differential pair circuit 105 can be easily canceled out.

Also, one advantage of the buffer circuit 104 having the auto-zero circuit 20 in the present embodiment is low power consumption. Since a sufficiently long settling period can be given to the differential pair circuit 105, the operation frequency can be lowered. Here, a settling period refers to a period from when a digital signal is input into the DAC to when the output of an analog signal is finally settled.

Also, since performing no chopper operation, the buffer circuit 104 in Embodiment 2 can be more easily designed to lower the operation frequency than is the buffer circuit 104 having the suppression circuit 106 in Embodiment 1, and therefore achieves better power consumption.

As mentioned above, in solid-state imaging device 1 according to Embodiment 2, the suppression circuit 106 includes an auto-zero circuit 20 connected to the differential pair circuit 105.

In this way, the auto-zero circuit samples the shift (offset voltage) due to the manufacturing variation and cancels the offset voltage with the sampled voltage. Specifically, the above characteristic difference can be easily canceled out.

Sizes of the first transistor 509 and the second transistor 510 may be smaller than a size of another transistor in the D/A conversion circuit 101.

In this way, the circuit area occupied by the buffer circuit can be made small, which can reduce the circuit cost of the buffer circuit.

The buffer circuit 104 may be a pre-charge circuit that pre-charges, to the base voltage, a capacitive element externally connected to the D/A conversion circuit 101.

In this way, with the pre-charge by the buffer circuit, it is possible to reduce the processing time of A/D conversion performed a plurality of times in the solid-state imaging device. That is, the speed of the imaging operation of the solid-state imaging device is easily increased.

The D/A conversion circuit 101 may include a buffer circuit 113 connected in parallel to the buffer circuit 104, and the buffer circuit 113 may or may not include the auto-zero circuit 20 as the suppression circuit 106.

In this way, the noise originating from the manufacturing variation of the buffer circuit can be effectively reduced with a simple circuit configuration.

The D/A conversion circuit 101 may include a plurality of buffer circuits including the buffer circuit 104, and the buffer circuits, in other words, buffer circuit 113, buffer circuit 114 and, buffer circuit 117, other than the buffer circuit 104 among the plurality of buffer circuits may or may not include the auto-zero circuit 20 as the suppression circuit 106.

In this way, the noise originating from the manufacturing variation of the buffer circuit can be effectively reduced with a simple circuit configuration.

The D/A conversion circuit 101 may include a buffer circuit 113 connected in parallel to the buffer circuit 104, and sizes of the first transistor 509 and the second transistor 510 may be smaller than a size of a transistor forming a differential pair circuit in the buffer circuit 113.

In this way, the circuit area occupied by the buffer circuit can be made small, which can reduce the circuit cost of the buffer circuit.

The D/A conversion circuit 101 may include a plurality of buffer circuits including the buffer circuit 104, and sizes of the first transistor 509 and the second transistor 510 may be smaller than a size of a transistor forming a differential pair circuit in the buffer circuits, in other words, buffer circuit 113, buffer circuit 114 and, buffer circuit 117, other than the buffer circuit 104 among the plurality of buffer circuits.

In this way, the circuit area occupied by the buffer circuit can be made small, which can reduce the circuit cost of the buffer circuit.

Embodiment 3

In the present embodiment, an example of the configuration of a camera including the solid-state imaging device 1 in Embodiment 1 or 2 will be described. The solid-state imaging devices 1 according to Embodiments 1 and 2 described above can each be used, as an imaging device (image input device), in an imaging apparatus, such as a digital video camera or a digital still camera.

Figure 14:
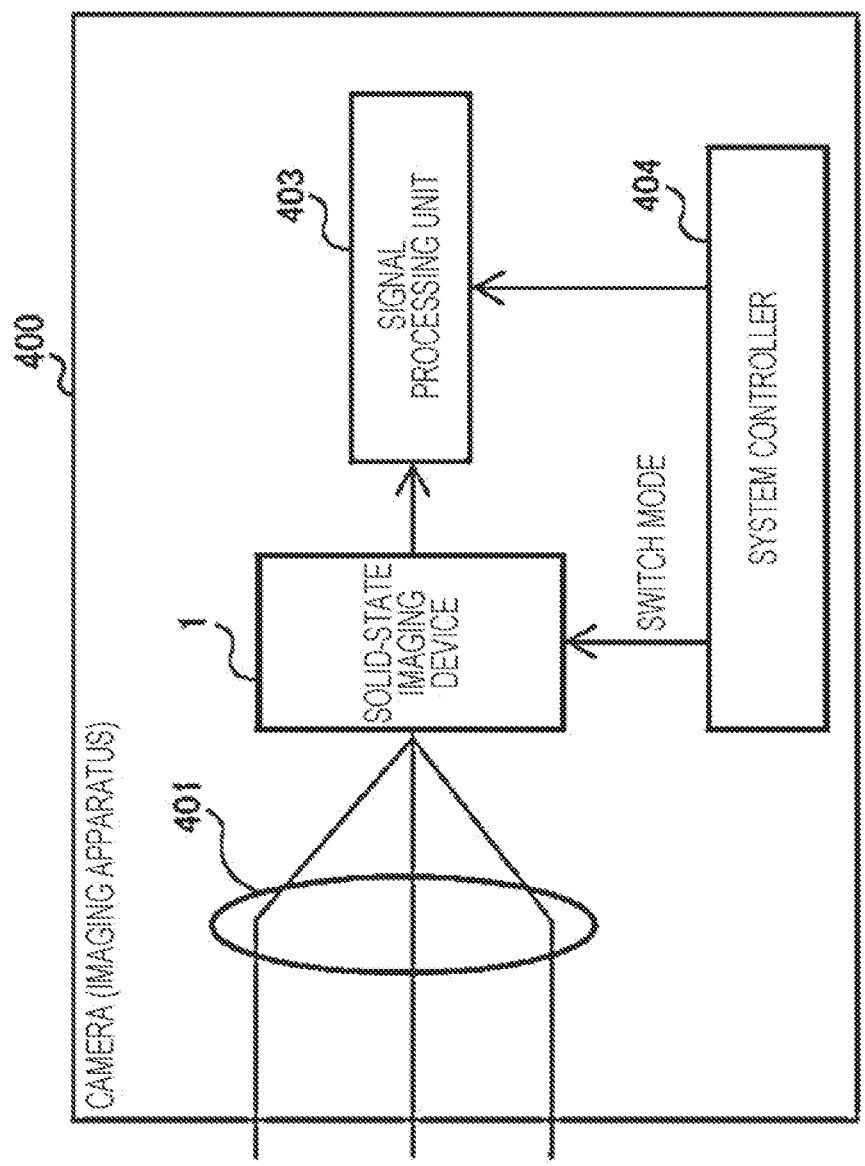
FIG. 14 is a block diagram illustrating an example of the configuration of a camera in Embodiment 3.

FIG. 14 is a block diagram illustrating an example of the configuration of a camera 400 in Embodiment 3.

In FIG. 14, the camera 400 has the solid-state imaging device 1 and, as an optical system that guides incident light to (forms an image of a subject on) the imaging surface of the solid-state imaging device 1, a lens 401 that focuses incident light (image light) on the imaging surface, for example. This camera 400 further includes a system controller 404 that drives the solid-state imaging device 1, and a signal processing unit 403 that processes the output signal of the solid-state imaging device 1.

The solid-state imaging device 1 outputs an image signal obtained by converting image light focused on its imaging surface by the lens 401 into an electrical signal on a pixel-by-pixel basis. The solid-state imaging device according to Embodiment 1 or 2 is used as this solid-state imaging device 1.

The signal processing unit 403 performs various kinds of signal processing on the image signal output from the solid-state imaging device 1. The system controller 404 controls the solid-state imaging device 1 and the signal processing unit 403.

The image signal processed by the signal processing unit 403 is recorded in a recording medium, such as a memory, for example. The image information recorded in the recording medium is hard-copied by a printer or the like. Also, the image signal processed by the signal processing unit 403 is displayed as a video on a monitor including a liquid crystal display or the like.

As described above, the camera 400 as an imaging apparatus, such as a digital still camera, is equipped with the solid-state imaging device 1. Accordingly, the noise originating from the manufacturing variation of its buffer circuit can be reduced. Therefore, high-quality images can be captured. Also, since the characteristic difference between the first transistor and the second transistor is canceled out, the size of the first transistor and the size of the second transistor can be reduced. This makes it possible to reduce the circuit area of the buffer circuit and reduce the manufacturing cost.

It is needless to say that the present disclosure is not limited to the above-described embodiments but various changes can be made and these are included within the scope of the present disclosure.

Note that the solid-state imaging device according to the present disclosure is not limited to the above-described embodiments. The present disclosure include other embodiments implemented by combining any given constituent elements in the embodiments, modifications which those skilled in the art would conceive from the embodiments without departing from the gist of the present disclosure and obtain by using various changes, such as an organic laminated film sensor and a back-illuminated sensor, and various instruments incorporating the solid-state imaging device according to the present disclosure.

Note that in Embodiments 1 and 2 configuration examples have been described in which the suppression circuit 106 is included in the buffer circuit 104 serving as a pre-charge circuit. However, the configuration is not limited to this. For example, the suppression circuit 106 may be included in at least one of the buffer circuit 113, the buffer circuit 114, or the buffer circuit 117 in FIG. 3 or 9.

Alternatively, the suppression circuit 106 may be included in another buffer circuit having an op amp like the differential pair circuit 105.

The solid-state imaging device and the camera in the present disclosure are beneficial in use for digital video cameras, digital still cameras, cellular phones, and the like.

What is claimed is:

1. A solid-state imaging device comprising:
a pixel unit that outputs a pixel signal corresponding to an amount of incident light;
an analog-to-digital (A/D) converter that performs A/D conversion on the pixel signal; and
a digital-to-analog (D/A) conversion circuit that generates a reference signal to be used by the A/D converter, wherein
the D/A conversion circuit includes a first buffer circuit that outputs a base voltage for generating the reference signal, and
the first buffer circuit includes a differential pair circuit including a first transistor and a second transistor, and a suppression circuit that suppresses a variation in the base voltage by canceling out a characteristic difference between the first transistor and the second transistor.

2. The solid-state imaging device according to claim 1, wherein the suppression circuit alternately switches connection relationship with the first transistor and the second transistor in the differential pair circuit.

3. The solid-state imaging device according to claim 1, wherein the differential pair circuit receives differential signals corresponding to the base voltage, the suppression circuit includes a first circuit that alternately switches inputs of the differential signals to the differential pair circuit, and a second circuit that alternately switches outputs of the differential signals from the differential pair circuit, and a timing of switching of the first circuit is the same as a timing of switching of the second circuit.

4. The solid-state imaging device according to claim 3, wherein the first circuit has two input terminals and two output terminals, and switches connection of the two input terminals with the two output terminals between straight connection and crossed connection, and the second circuit has two input terminals and two output terminals, and switches connection of the two input terminals with the two output terminals between straight connection and crossed connection.

5. The solid-state imaging device according to claim 1, wherein sizes of the first transistor and the second transistor are smaller than a size of a transistor other than the first transistor and the second transistor in the D/A conversion circuit.

6. The solid-state imaging device according to claim 1, wherein the first buffer circuit is a pre-charge circuit that pre-charges, to the base voltage, a capacitive element connected to the D/A conversion circuit.

7. The solid-state imaging device according to claim 1, wherein the suppression circuit includes an auto-zero circuit connected to the differential pair circuit.

8. The solid-state imaging device according to claim 7, wherein sizes of the first transistor and the second transistor are smaller than a size of a transistor other than the first transistor and the second transistor in the D/A conversion circuit.

9. The solid-state imaging device according to claim 7, wherein the first buffer circuit is a pre-charge circuit that pre-charges, to the base voltage, a capacitive element connected to the D/A conversion circuit.

10. The solid-state imaging device according to claim 1, wherein the D/A conversion circuit includes a second buffer circuit connected in parallel to the first buffer circuit, and the second buffer circuit includes a differential pair circuit including two transistors, and does not include a suppression circuit that suppresses a variation in the base voltage by canceling out a characteristic difference between the two transistors.

11. The solid-state imaging device according to claim 1, wherein the D/A conversion circuit includes buffer circuits including the first buffer circuit, and one or more buffer circuits other than the first buffer circuit among the buffer circuits each include a differential pair circuit including two transistors, and does not include a suppression circuit that suppresses a variation in the base voltage by canceling out a characteristic difference between the two transistors.

12. The solid-state imaging device according to claim 1, wherein the D/A conversion circuit includes a second buffer circuit connected in parallel to the first buffer circuit, and sizes of the first transistor and the second transistor are smaller than a size of a transistor included in a differential pair circuit in the second buffer circuit.

13. The solid-state imaging device according to claim 1, wherein the D/A conversion circuit includes buffer circuits including the first buffer circuit, and sizes of the first transistor and the second transistor are smaller than a size of a transistor included in a differential pair circuit in one or more buffer circuits other than the first buffer circuit among the buffer circuits.

14. A camera comprising the solid-state imaging device according to claim 1.

* * * * *